United States Patent [19]

Babich et al.

[11] Patent Number: 5,059,512

[45] Date of Patent: Oct. 22, 1991

[54] ULTRAVIOLET LIGHT SENSITIVE PHOTOINITIATOR COMPOSITIONS, USE THEREOF AND RADIATION SENSITIVE COMPOSITIONS

[75] Inventors: Edward D. Babich, Chappaqua, N.Y.; Jeffrey D. Gelorme, Plainville, Conn.; Michael Hatzakis, Chappaqua, N.Y.; Jane M. Shaw, Ridgefield, Conn.; Kevin J. Stewart, Lake Peekskill; David F. Witman, Pleasantville, both of N.Y.

[73] Assignee: International Business Machines Corporation, Armonk, N.Y.

[21] Appl. No.: 419,047

[22] Filed: Oct. 10, 1989

[51] Int. Cl.$^5$ .................. G03F 7/029; C08F 8/18
[52] U.S. Cl. .................. 430/280; 430/270; 430/281; 430/286; 430/926; 522/25; 522/31; 502/158; 502/172; 502/150; 502/168; 502/522
[58] Field of Search .................. 522/25, 31; 502/158, 502/172, 150, 168, 522; 430/270, 280, 281, 286

[56] References Cited

U.S. PATENT DOCUMENTS

| | | | |
|---|---|---|---|
| 3,294,717 | 12/1966 | Krantz | 260/18 |
| 4,069,054 | 1/1978 | Smith | 430/921 X |
| 4,100,134 | 7/1978 | Robins et al. | 528/10 |
| 4,173,476 | 11/1979 | Smith et al. | 522/31 X |
| 4,218,531 | 8/1980 | Carlson | 430/280 |
| 4,291,114 | 9/1981 | Berggren et al. | 430/253 |
| 4,318,766 | 3/1982 | Smith | 156/330 |
| 4,548,890 | 10/1985 | Dickinson et al. | 430/280 |
| 4,600,685 | 7/1986 | Kitakohji et al. | 430/313 |
| 4,623,676 | 11/1986 | Kistner | 522/15 |
| 4,626,556 | 12/1986 | Nozue et al. | 522/99 |
| 4,640,967 | 2/1987 | Eckberg | 528/26 |
| 4,657,843 | 4/1987 | Kukuyama et al. | 430/323 |
| 4,689,289 | 8/1987 | Crivello | 522/31 X |
| 4,745,169 | 5/1988 | Sugiyama et al. | 528/43 |
| 4,760,013 | 7/1988 | Hacker et al. | 430/921 X |
| 4,882,201 | 11/1989 | Crivello et al. | 522/25 X |

Primary Examiner—Cynthia Hamilton
Attorney, Agent, or Firm—Pollock, Vande Sande & Priddy

[57] ABSTRACT

An ultraviolet light sensitive photoinitiator composition that includes at least one anthracene derivative represented by the formula:

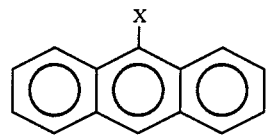

wherein X is $CH=CH_2$ or $-(-CH_2-)_n-O-(-R)$ with R being H or

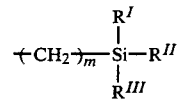

wherein each $R^I$, $R^{II}$ and $R^{III}$ individually is selected from the group of alkyl, alkenyl, aryl,

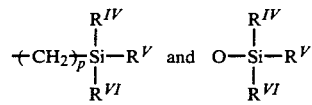

wherein each $R^{IV}$, $R^V$ and $R^{VI}$ individually is selected from the group of alkyl, alkenyl and aryl; wherein m is an integer of 0 to 4, p is an integer of 0 to 4; and is n being 1 to 2; and onium salt; and an organic solvent. The composition is used for cationic polymerization of cationic polymerizable materials including in the formation of a pattern of a photoresist. Also certain novel epoxy-functionalized organosilicons are provided that are sensitive to radiation including E-beam radiation and exhibit resistance to oxygen reactive ion etching.

16 Claims, No Drawings

ULTRAVIOLET LIGHT SENSITIVE PHOTOINITIATOR COMPOSITIONS, USE THEREOF AND RADIATION SENSITIVE COMPOSITIONS

DESCRIPTION

1. Technical Field

The present invention is concerned with ultraviolet sensitive photoinitiator composition. The compositions of the present invention are especially useful for promoting cationic polymerizations. In particular, the compositions of the present invention find particular applicability in the formation of patterns of photoresists employing imagewise exposure with ultraviolet light. The compositions of the present invention exhibit increased photospeed. Also the photoinitiator compositions of the present invention are useful for initiating the polymerization of a wide variety of cationic polymerizable monomers and polymers.

The present invention is also concerned with certain epoxy-functionalized organosilicon compositions that are sensitive to radiation including E-beam and exhibit resistance to oxygen reactive ion etching.

2. Background Art

Various compounds have been suggested as photoinitiators for photochemically induced cationic polymerizations of such materials as epoxy resins, cyclic ethers, cyclic esters, such as cyclic formals and cyclic acetals, polyvinyl acetals, phenoplasts, aminoplasts, lactones and silicones.

Along these lines, see U.S. Pat. No. 4,161,478 to Crivello, and Watt, et al., "A Novel Photoinitiator of Cationic Polymerization: Preparation and Characterization of Bis[4-(diphenylsulfonio)phenyl]sulfide-Bis-Hexafluorophosphate", *Journal of Polymer Science: Polymer Chemistry Edition*, Vol. 22, p. 1789, 1980 John Wiley & Sons, Inc.

Certain sulfonium and iodonium salts have been suggested as the initiators for such cationic polymerizations. Additional discussions concerning these previously suggested sulfonium and iodonium salts can be found, for instance, in Pappas, et al., "Photoinitiation of Cationic Polymerization. III. Photosensitization of Diphenyliodonium and Triphenylsulfonium Salts", *Journal of Polymer Science: Polymer Chemistry Edition*, Vol. 22, pp. 77-84, 1984 John Wiley & Sons, Inc.; Crivello, et al., "Photoinitiated Cationic Polymerization with Triarylsulfonium Salts", *Journal of Polymer Science: Polymer Chemistry Edition*, Vol. 17, pp. 977-999, 1979 John Wiley & Sons, Inc.; Crivello, et al., "Complex Triarylsulfonium Salt Photoinitiators. I. The Identification, Characterization, and Syntheses of a New Class of Triarylsulfonium Salt Photoinitiators", *Journal of Polymer Science: Polymer Chemistry Edition*, Vol. 18, pp. 2677-2695, 1980 John Wiley & Sons, Inc.; and Crivello, "Cationic Polymerization—Iodonium and Sulfonium Salt Photoinitiators", *Advances in Polymer Science*, Series #62, pp. 1-48.

Various photoinitiators are also discussed in U.S. Pat. Nos. 4,175,972; 4,442,197; 4,139,655; 4,400,541; 4,197,174; 4,173,476; 4,069,055 and 4,299,938 and European patent applications 84/0094914 and 84/0126712.

Although various of the prior art onium salts are very efficient photoinitiators for a wide range of cationic polymerizable materials, such suffer from the deficiency that ultraviolet light absorption in the 300-400 nanometer range is lacking. This range, however, represents an important range given off by mercury lamps. In order to render these onium salts usable in such ranges, it is necessary to add a photosensitizer that absorbs light in the 300-400 nanometer range to the onium salt. Examples of previously suggested photosensitizers are perylene, anthracene and various alkyl derivatives of anthracene.

Although these materials have been effective as photosensitizers, their use has been restricted because such are either unsoluble or exhibit only very limited solubility in common organic solvent. This problem of solubility precludes use of these photosensitizers in thin films (e.g. thickness <10 microns) applications.

SUMMARY OF THE INVENTION

The present invention provides for ultraviolet sensitive photoinitiator compositions that include photosensitizers which are not only extremely effective, but also exhibit high solubility in a variety of common organic solvents.

In particular, the present invention is concerned with light sensitive photoinitiator compositions that are especially suitable for cationic polymerizations. The compositions of the present invention contain:

at least one anthracene derivative represented by the formula:

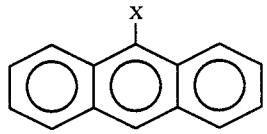

wherein X is CH=CH$_2$ or

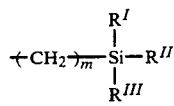

with R being selected from the group of H,

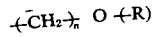

and n is an integer of 1 to 2;

wherein each R$^I$, R$^{II}$ and R$^{III}$ individually is selected from the group of alkyl, alkenyl, aryl,

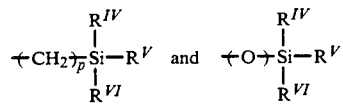

wherein each R$^{IV}$, R$^V$ and R$^{VI}$ individually is selected from the group of alkyl, alkenyl and aryl; and wherein m is an integer of 0 to 4 and p is an integer of 0 to 4;

B) an onium salt; and

C) an organic solvent wherein the weight ratio of A:B is about 1:2 to about 1:10.

In addition, the present invention is concerned with ultraviolet light sensitive compositions which contain:

A) a cationically polymerizable material;

B) an onium salt in an amount sufficient to cause polymerization of the cationically polymerizable material; and C) an anthracene derivative represented by the formula:

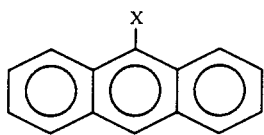

wherein X is $CH=CH_2$ or $—(CH_2—)—_n O—(—R)$ with R being selected from the group of H,

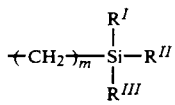

wherein m, $R^I$, $R^{II}$ and $R^{III}$ have the same meanings defined above, and n is an integer of 1 to 2; and wherein the weight ratio of B:C is about 1:2 to about 1:10.

The present invention is also concerned with forming a pattern of a photoresist. The process includes providing on a substrate an uncured film of:

1) a cationic polymerizable material;
2) an onium salt in an amount sufficient to cause polymerization of the cationic polymerizable material; and
3) an anthracene derivative represented by the formula:

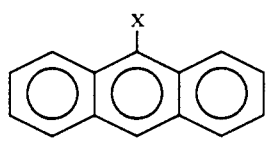

wherein X is $CH=CH_2$ or $—(—CH_2—)—_n O—(—R)$ with R being selected from the group of H,

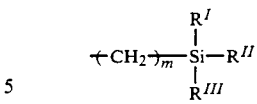

wherein m, $R^I$, $R^{II}$ and $R^{III}$ have the same meanings defined above, and n is an integer of 1 to 2; and wherein the weight ratio of 2:3 is about 1:2 to about 1:10

The uncured film is imagewise exposed to ultraviolet light in a pattern to thereby cause cationic polymerization of the film in the exposed pattern. The photoresist is then developed by removing the unexposed portion of the film.

Another aspect of the present invention is concerned with radiation sensitive epoxy functionalized organosilicon glass resins represented by the following formulae II and III:

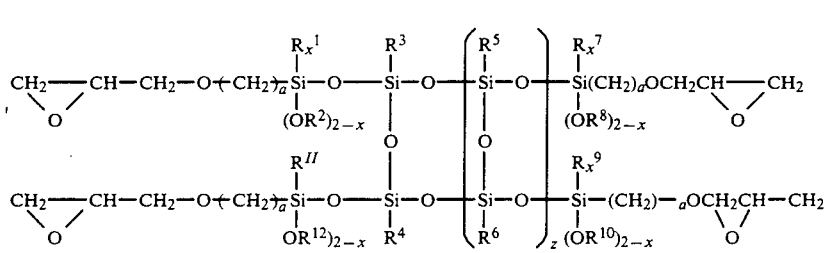

and

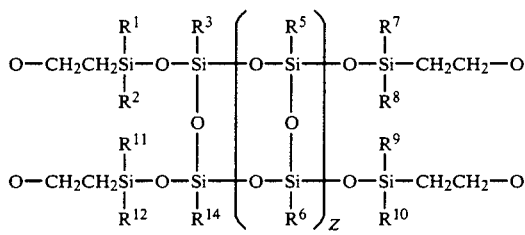

Each $R^1$, $R^2$, $R^3$, $R^4$, $R^5$, $R^6$, $R^7$, $R^8$, $R^9$, $R^{10}$, $R^{11}$ and $R^{12}$ in the above formulae II and III are well-known and are typified by radicals usually associated with silicon-bonded organic groups and silcon-bonded hydrogen groups. Each $R^1$, $R^2$, $R^3$, $R^4$, $R^5$, $R^6$, $R^7$, $R^8$, $R^9$, $R^{10}$, $R^{11}$, and $R^{12}$ radical in the above formulae II and III is individually selected from the group of hydrogen, monovalent hydrocarbon radicals, epoxy groups, mercapto radical, and cyanoalkyl radicals.

Each a is an integer from 0 to 12 and preferably 0–3. Z is an integer from 1 to $10^2$ and preferably about 10 to about 20. Each x is an integer from 0 to 2.

In addition, the present invention is concerned with forming a pattern of a photoresist from the above organosilicon compounds of formulae II and III. The process includes providing on a substrate an uncured film of an organosilicon material of formula II or III. Imagewise exposing the film to radiation such as electron-beam radiation to thereby cause polymerization of the film in the exposed pattern. The photoresist is then developed by removing the unexposed portion of the film.

BEST AND VARIOUS MODES FOR CARRYING OUT INVENTION

In accordance with the present invention, certain anthracene derivatives are employed in ultraviolet light sensitive photoinitiator compositions. These anthracene derivatives act to sensitize the compositions to ultraviolet light in the 300–400 nanometer range. In addition, the specific anthracene derivatives required by the present invention are readily soluble in a wide variety of common organic solvents. It is critical to the success of the present invention that the anthracene derivative employed be one or more compounds represented by the formula:

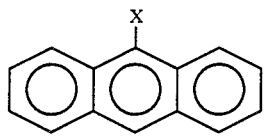

wherein X is $CH=CH_2$ or $-(-CH_2-)_n-O-(-R)$ with R being H or

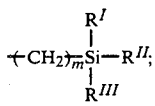

n being an integer of 1 to 2, and preferably 1 to 0; m being an integer of 0 to 4 and preferably 0; and wherein $R^I$, $R^{II}$ and $R^{III}$ individually is selected from the group of alkyl, alkenyl, aryl,

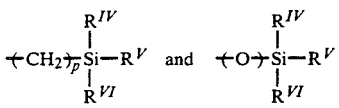

wherein each $R^{IV}$, $R^V$ and $R^{VI}$ individually is selected from the group of alkyl, alkenyl and aryl and wherein p is an integer of 0 to 4 and preferably one. Preferably each $R^I$, $R^{II}$ and $R^{III}$ is an alkyl group and most preferably is methyl.

Examples of suitable alkyl groups contain 1 to 6 carbon atoms and include methyl, ethyl, propyl, butyl and pentyl.

Examples of alkenyl groups contain 2–6 carbon atoms and include ethylene, propylene, and butylene.

Examples of aryl groups contain 6 to 14 carbon atoms and include phenyl, naphthyl and anthracyl.

Specific anthracene derivatives suitable for use in the present invention are:

9 - anthracene methanol;

9 - vinyl anthracene and the trimethylsiloxy ether of 9 - anthracene methanol.

The ultraviolet light sensitive photoinitiator compositions of the present invention also contain a radiation sensitive onium salt.

Examples of suitable onium salts include aromatic onium salts of Group IV elements discussed in U.S. Pat. No. 4,175,972, disclosure of which is incorporated herein by reference, and aromatic onium salts of Group Va elements discussed in U.S. Pat. No. 4,069,055, disclosure of which is incorporated herein by reference.

Aromatic Group IVa onium salts include those represented by the formula:

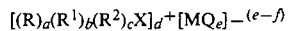

where R is a monovalent aromatic organic radical, $R^1$ is a monovalent organic aliphatic radial selected from alkyl, cycloalkyl and substituted alkyl, $R^2$ is a polyvalent organic radical forming a heterocyclic or fused ring structure selected from aliphatic radicals and aromatic radicals, X is a Group IVa element selected from sulfur, selenium, and tellurium, M is a metal or metalloid, Q is a halogen radical, a is a whole number equal to 0 to 3 inclusive, b is a whole number equal to 0 to 2 inclusive, c is a whole number equal to 0 or 1, where the sum of a+b+c is a value equal to 3 or the valence of X, $$d=e-f$$

f=valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl, and such radicals substituted with up to 1 to 4 monovalent radicals such as $C_{(1-8)}$ alkoxy, $C_{(1-8)}$ alkyl, nitro, chloro, and hydroxy; arylacyl radicals such as benzyl and phenylacyl; aromatic heterocyclic radicals such as pyridyl and furfuryl. $R^1$ radicals include $C_{(1-8)}$ alkyl such as methyl and ethyl, substituted alkyl such as $-C_2H_4OCH_3$, $-CH_2COOC_2H_5$, $-CH_2COCH_3$, etc. $R^2$ radicals include such structures as:

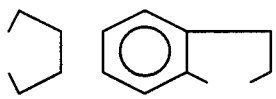

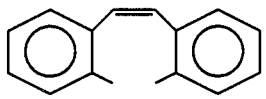

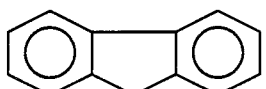

, etc.

Complex anions included by $MQ_e^{-(e-f)}$ of Formula I are, for example, $BF_4^-$, $PF_6^-$, $SbF_6^-$, $FeCl_4^-$, $SnCl_6^-$, $SbCl_6^-$, $BiCl_5^-$, $AlF_6^{-3}$, $GaCl_4^-$, $InF_4^-$, $TiF_6^-$, $ZrF_6^-$, etc., where M is a transition metal such as Sb, Fe, Sn, Bi, Al, Ga, In, Ti, Zr, Sc, V, Cr, Mn, Cs, rare earth elements such as the lanthanides, for example, Ce, Pr, Nd, etc., actinides, such as Th, Pa, U, Np, etc. and metalloids such as B, P, and As.

Group VIa onium salts includes by Formula I are, for example:

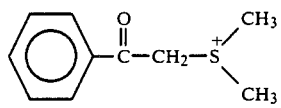

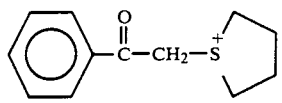 PF$_6^-$

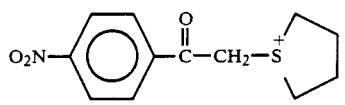 AsF$_6^-$

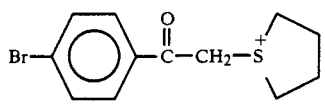 SbF$_6^-$

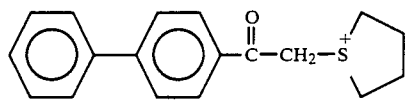 FeCl$_4^-$

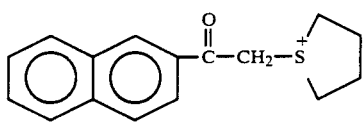 SnCl$_6^=$

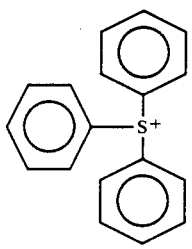 SbF$_6^-$

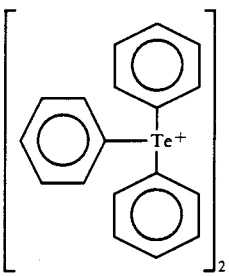 BiCl$_5^=$

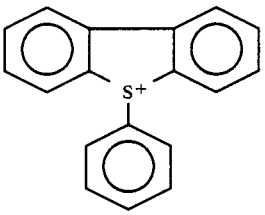 BF$_4^-$

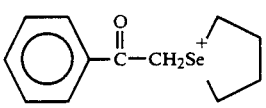 PF$_6^-$

Aromatic group Va onium salts include those represented by the formula:

$$[(R)_a(R^1)_b(R^2)_cX^1]_d{}^+[MQ_e]^{-(e-f)} \qquad (2)$$

where R is a monovalent aromatic organic radical selected from carbocyclic radicals and heterocyclic radicals, $R^1$ is a monovalent organic aliphatic radical selected from alkyl, alkoxy, cycloalkyl and substituted derivatives thereof, $R^2$ is a polyvalent organic radical forming an aromatic heterocyclic or fused ring structure with $X^1$, $X^1$ is a Group Va element selected from N, P, As, Sb, and Bi, M is a metal or metalloid, Q is a halogen radical, a is a whole number equal to 0 to 4 inclusive, b is a whole number equal to 0 to 2 inclusive, c is a whole number equal to 0 to 2 inclusive, and the sum of a+b+c is a value equal to 4 or the valence of $X^1$, $$d = e - f$$

f = valence of M and is an integer equal to from 2 to 7 inclusive, e is >f and is an integer having a value up to 8.

Radicals included by R are, for example, $C_{(6-13)}$ aromatic hydrocarbon radicals such as phenyl, tolyl, naphthyl, anthryl and such radicals substituted with up to 1 to 4 monovalent radicals such as $C_{(1-8)}$ alkoxy, $C_{(1-8)}$ alkyl, nitro, chloro, and hydroxy; arylacyl radicals such as phenylacyl; arylalkyl radicals such as phenyl ethyl; aromatic heterocyclic radicals such as pyridyl and furfuryl; $R^1$ radicals include $C_{(1-8)}$ alkyl, $C_{(3-8)}$ cycloalkyl, substituted alkyl such as haloalkyl, for example, chloroethyl; alkoxy such as $OCH_2C_6H_5$ and $OCH_3$; alkoxyalkyl such as $-C_2H_4OCH_3$; alkylacyl such as $-CH_2COOC_2H_5$; ketoalkyl such as $-CH_2COCH_3$.

Radicals included by $R^2$ are, for example:

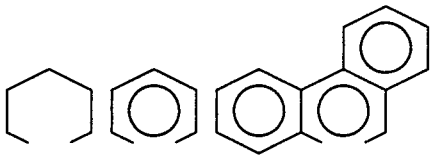

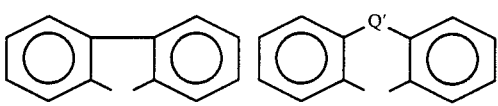

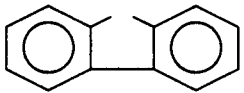

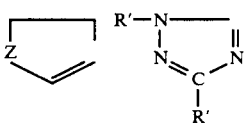

where Q' is selected from O, $CH_2$, N, R, and S; Z is selected from —O—, —S— and

and R' is a monovalent radical selected from hydrogen and hydrocarbon. Complex anions included by $MQ_e^{-(e-f)}$ are, for example, $FB_4^-$, $PF_6^-$, $AsF_6^-$, $FeCl_4^=$, $SnCl_6^-$, $SbCl_6^-$, $BiCl_5^=$, where M is more particularly a transition metal such as Sb, Fe, Sn, Bi, Al, Ga, In, Ti, Zr, Sc, V, Cr, Mn, and Co; rare earth elements such as the lanthanides, for example, Ce, Pr, and Nd; actinides such as Th, Pa, U, and Np; and metalloids such as B, P, and As.

Anions which are slightly hydrolyzed, e.g. $SbF_5OH$—are considered to be the full equivalent if to unhydrolyzed from of the anion for the purposes of the present invention.

The weight ratio of the anthracene derivative to the onium salt is usually about 1:2 to about 1:10 and preferably about 1:4 to about 1:5.

In addition, the photoinitiator compositions usually include an organic solvent in order to facilitate a mixture of the components of the above compositions with a polymerizable composition for use of the initiator.

Suitable organic solvents include monohydric saturated aliphatic alcohols such as methanol; ethanol, n-propanol, iso-propanol and n-butanol, aromatic hydrocarbons such as benzene, toluene and xylene; propylene glycol monomethyl ether, propylene glycol monomethyl ether acetate, 2 methoxy ethanol and 2 methoxy ethylether.

The organic solvents are usually employed in amounts of about 30% to about 90% and preferably about 60% to about 75% based upon the total weight of all of the components.

The light sensitive compositions of the present invention are useful as photoinitiators for cationic polymerizations such as polymerizations of epoxy polymers, phenoplast, aminoplast, polyvinylacetals, lactones, cyclic ethers, and cyclic esters such as cyclic acetates and cyclic formals, and silicones.

Typical examples of epoxy polymers include the epoxidized novolak polymers and the polyepoxides from halo-epoxy alkanes such as epichlorohydrin and a polynuclear dihydric phenol such as bisphenol A. Mixtures of epoxides can be used when desired.

The epoxidized novolak polymers are commercially available and can be prepared by known methods by the reaction of a thermoplastic phenolic aldehyde of a phenol with a halo-epoxy alkane. The phenol can be a mononuclear or polynuclear phenol. Examples of mononuclear phenols have the formula:

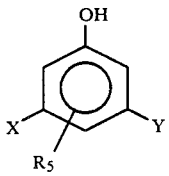

wherein X, Y, and $R_5$ are hydrocarbons containing no more than about 12 carbon atoms.

Hydrocarbon-substituted phenols having two available positions ortho or para to a phenolic hydroxy group for aldehyde condensation to provide polymers suitable for the preparation of epoxy novolaks include o- and p-cresols, o- and p-ethyl phenols, o- and p-isopropyl phenols, o- and p-tert-butyl phenols, o- and p-secbutyl phenols, o- and p-amyl phenols, o- and p-octyl phenols, o- and p-nonyl phenols, 2,5-xylenol, 3,4-xylenol, 2,5-diethyl phenol, 3,4-diethyl xylenol, 2,5-diisopropyl phenol, 4-methyl resorcinol, 4-ethyl resorcinol, 4-isopropyl resorcinol, 4-tert-butyl resorcinol, o- and p-benzyl phenol, o- and p-phenethyl phenols, o- and p-phenyl phenols, o- and p-tolyl phenols, o- and p-xylyl phenols, o- and p-cyclohexyl phenols, o- and p-cyclopentyl phenols, 4-phenethyl resorcinol, 4-tolyl resorcinol, and 4-cyclohexyl resorcinol.

Various chloro-substituted phenols which can also be used in the preparation of phenol-aldehyde resins suitable for the preparation of the epoxy novolaks include o- and p-chloro-phenols, 2,5-dichloro-phenol, 2,3-dichloro-phenol, 3,4-dichloro-phenol, 2-chloro-3-methyl-phenol, 2-chloro-5-methyl-phenol, 3-chloro-2-methyl-phenol, 5-chloro-2-methyl-phenol, 3-chloro-4-methyl-phenol, 4-chloro-3-methyl-phenol, 4-chloro-3-methyl-phenol, 4-chloro-3-isopropyl-phenol, 3-chloro-4-phenyl-phenol, 3-chloro-4-chloro-phenyl-phenol, 3,5-dichloro-4-methyl-phenol, 3,5-dichloro-5-methyl-phenol, 3,5-dichloro-2-methyl-phenol, 2,3-dichloro-5-methylphenol, 2,5-dichloro-3-methyl-phenol, 3-chloro-4,5-dimethyl-phenol, 4-chloro-3,4-dimethyl-phenol, 2-chloro-3,5-dimethyl-phenol, 5-chloro-2,3-dimethyl-phenol, 5-chloro-3,5-dimethyl-phenol, 2,3,5-trichloro-phenol, 3,4,5-trichloro-phenol, 4-chloro-resorcinol, 4,5-dichloro-resorcinol, 4-chloro-5-methyl-resorcinol, 5-chloro-4-methyl-resorcinol.

Typical phenols which have more than two positions ortho or para to a phenolic hydroxy group available for aldehyde condensation and which, by controlled aldehyde condensation, can also be used are: phenol, m-cresol, 3,5-xylenol, m-ethyl and m-isopropyl phenols, m,m'-diethyl and diisopropyl phenols, m-butyl-phenols, m-amyl phenols, m-octyl phenols, m-nonyl phenols, resorcinol, 5-methyl-resorcinol, 5-ethyl resorcinol.

Examples of polynuclear dihydroxy phenols are those having the formula:

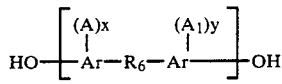

wherein Ar is an aromatic divalent hydrocarbon such as naphthylene and, preferably, phenylene; A and $A_1$ which can be the same or different are alkyl radicals, preferably having from 1 to 4 carbon atoms, halogen atoms, i.e., fluorine, chlorine, bromine, and iodine, or alkoxy radicals, preferably having from 1 to 4 carbon atoms; x and y are integers having a value 0 to a maximum value corresponding to the number of hydrogen atoms on the aromatic radical (Ar) which can be replaced by substituents and $R_6$ is a bond between adjacent carbon atoms as in dihydroxydiphenyl or is a divalent radical including, for example:

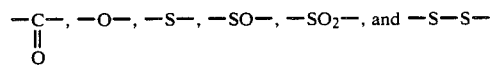

and divalent hydrocarbon radicals, such as alkylene, alkylidene, cycloaliphatic, e.g., cycloalkylene and cycloalkylidene, halogenated, alkoxy or aryloxy substituted alkylene, alkylidene and cycloaliphatic radicals, as well as alkarylene and aromatic radicals including halogenated, alkyl, alkoxy or aryloxy substituted aromatic radicals and a ring fused to an Ar group; or $R^1$ can be polyalkoxy, or polysiloxy, or two or more alkylidene radicals separated by an aromatic ring, a tertiary amino group, an ether linkage, a carbonyl group or a sulfur containing group such as sulfoxide, and the like.

Examples of specific dihydroxy polynuclear phenols include, among others, the bis-(hydroxyphenyl)alkanes such as 2,2'-bis-(4-hydroxyphenyl)propane, 2,4'-dihydroxydiphenylmethane, bis-(2-hydroxyphenyl)methane, bis(4-hydroxyphenyl)methane, bis(4-hydroxy-2,6-dimethyl-3-methoxyphenyl)methane, 1,1'-bis-(4-hydroxyphenyl)ethane, 1,2'-bis-(4-hydroxyphenyl)ethane, 1,1'-bis-(4-hydroxy-2-chlorphenyl)ethane, 1,1'-bis(3-methyl-4-hydroxyphenyl) ethane, 1,3'-bis-(3-methyl-4-hydroxyphenyl)propane, 2,2'-bis-(3-phenyl-4-hydroxyphenyl)propane, 2,2'-bis-(3-isopropyl-4-hydroxyphenyl)propane, 2,2'-bis(2-isopropyl-4-hydroxyphenyl)pentane, 2,2'-bis-(4-hydroxyphenyl) heptane, bis-(4-hydroxyphenyl)phenylmethane, bis-(4-hydroxyphenyl)cyclohexylmethane, 1,2'-bis-(4-hydroxyphenyl)-1,2'-bis-(phenyl)propane and 2,2'-bis-(4-hydroxyphenyl)-1-phenyl-propane; di(hydroxyphenyl) sulfones such as bis-(4-hydroxyphenyl)sulfone, 2,4'-dihydroxydiphenylsulfone, 5'-chloro-2,4'-dihydroxydiphenyl sulfone, and 5'-chloro-4,4'-dihydroxydiphenyl sulfone; di(hydroxyphenyl)ethers such as bis-(4-hydroxyphenyl)ether, the 4,4'-, 4,2'-, 2,2'-, 2,3'-, dihydroxydiphenyl ethers, 4,4'-dihydroxy-2,6-dimethyldiphenyl ether, bis-(4-hydroxy-3-isobutylphenyl)ether, bis-(4-hydroxy-3-isopropylphenyl)ether, bis-(4-hydroxy-3-chlorophenyl)ether, bis-(4-hydroxy-3-fluorophenyl) ether, bis-(4-hydroxy-3-bromophenyl)ether, bis-(4-hydroxynaphthyl)ether, bis-(4-hydroxy-3-chloronaphthyl) ether, bis-(2-hydroxydiphenyl)ether, 4,4'-dihydroxy-2,6-dimethoxydiphenyl ether, and 4,4'-dihydroxy-2,5-diethoxydiphenyl ether.

The preferred dihydric polynuclear phenols are represented by the formula:

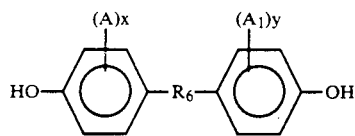

wherein A and A₁ are as previously defined, x and y have values from 0 to 4 inclusive and $R_6$ is a divalent saturated aliphatic hydrocarbon radical, particularly alkylene and alkylidene radicals having from 1 to 3 carbon atoms, and cycloalkylene radicals having up to and including 10 carbon atoms. The most preferred dihydric phenol is bisphenol A, i.e., 2,2'-bis(p-hydroxyphenyl)propane.

As condensing agents, any aldehyde may be used which will condense with the particular phenol being used, including formaldehyde, acetaldehyde, propionaldehyde, butyraldehyde, heptaldehyde,, cyclohexanone, methyl cyclohexanone, cyclopentanone, benzaldehyde, and nuclear alkyl-substituted benzaldehydes, such as toluic aldehyde, naphthaldehyde, furfuraldehyde, glyoxal, acrolein, or compounds capable of engendering aldehydes such as para-formaldehyde, hexamethylene tetramine. The aldehydes can also be used in the form of a solution, such as the commercially available formalin. The preferred aldehyde is formaldehyde.

The halo-epoxy alkane can be represented by the formula:

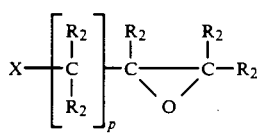

wherein X is a halogen atom (e.g., chlorine, bromine, and the like), p is an integer from 1-8, each $R^2$ individually is hydrogen or alkyl group of up to 7 carbon atoms; wherein the number of carbon atoms in any epoxy alkyl group totals no more than 10 carbon atoms.

While glycidyl ethers, such as derived from epichlorohydrin, are particularly preferred in the practice of this invention, the epoxy polymers containing epoxyalkoxy groups of a greater number of carbon atoms are also suitable. These are prepared by substituting for epichlorohydrin such representative corresponding chlorides or bromides of monohydroxy epoxyalkanes as 1-chloro-2,3-epoxybutane, 1-chloro-3,4-epoxybutane, 2-chloro-3,4-epoxybutane, 1-chloro-2-methyl-2,3-epoxypropane, 1-bromo-2,3-epoxypentane, 2-chloromethyl-1,2epoxybutane, 1-bromo-4-methyl-3,4-epoxypentane, 1-bromo-4-ethyl-2,3-epoxypentane, 4-chloro-2-methyl-2,3-epoxypentane, 1-chloro-2,3-epoxyoctane, 1-chloro-2-methyl-2,3-epoxyoctane, or 1-chloro-2,3-epoxydecane. Although it is possible to use haloepoxyalkanes having a greater number of carbon atoms than indicated above, there is generally no advantage in using those having a total of more than 10 carbon atoms.

In addition, the polyepoxides of halo epoxy alkane of the type discussed above and a polynuclear dihydric phenol of the type above can be employed. The preferred polyepoxides of this class being the polyepoxides of epichlorohydrin and bisphenol A, i.e., 2,2-bis(p-hydroxyphenyl)propane.

The initiator compositions of the present invention are especially suitable in polymerizations of organosilicon resins and most particularly the polysilsesquioxane prepolymers such as those having terminal hydroxyl groups. Examples of such can be represented by the structural formula:

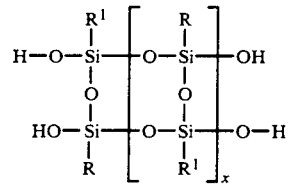

I.

Each R and $R^1$ in the above formula are well-known and are typified by radicals usually associated with silicon-bonded organic groups and silicon-bonded hydroxyl groups. Each R and $R_1$ radical in the above formula is individually selected from the group of hydrogen, monovalent hydrocarbon radicals, halogenated monovalent hydrocarbon radicals, epoxy groups, mercapto radicals, and cyanoalkyl radicals. Thus, the radicals R and $R^1$ may be alkyl, such as methyl, ethyl, propyl, butyl, and octyl; aryl radicals such as phenyl, tolyl, xylyl, and naphthyl radicals, aralkyl radicals such as benzyl, and phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, and chloromethyl; cyanoalkyl radicals such as cyanoethyl, and cyanopropyl. Preferably, the radicals represented by R and $R^1$ have less than eight carbon atoms and in particular it is preferred that R and $R^1$ be methyl, ethyl, or phenyl.

Especially preferred organosilicon polymers are certain epoxy-functional organosilicon glass resins. Such have high glass transition temperatures, high contrast and sensitivity and increased resistance to oxygen reactive ion etching.

Examples of such can be represented by the structural formulae II and III:

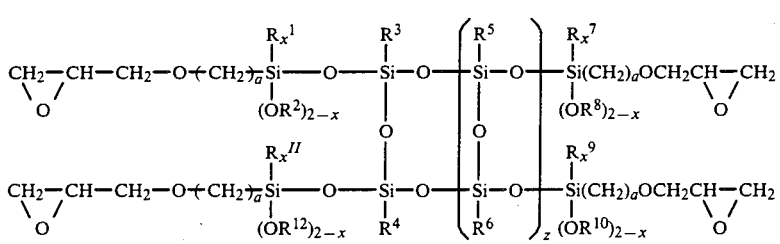

and

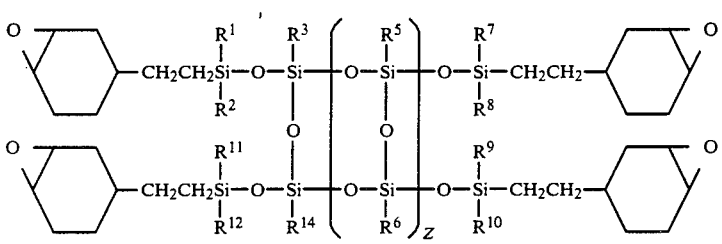

Each $R^1$, $R^2$, $R^3$, $R^4$, $R^5$, $R^6$, $R^7$, $R^8$, $R^9$, $R^{10}$, $R^{11}$ and $R^{12}$ in the above formulae II and III are well-known and are typified by radicals usually associated with silicon-bonded organic groups and silcon-bonded hydrogen groups. Each $R^1$, $R^2$, $R^3$, $R^4$, $R^5$, $R^6$, $R^7$, $R^8$, $R^9$, $R^{10}$, $R^{11}$, and $R^{12}$ radical in the above formulae II and III is individually selected from the group of hydrogen, monovalent hydrocarbon radicals, epoxy groups, mercapto radical, and cyanoalkyl radicals. Thus, the radicals $R^1$ through $R^{12}$ may be alkyl, such as methyl, ethyl, propyl, butyl, and octyl; aryl radicals such as phenyl, tolyl, xylyl, and naphthyl radicals, aralkyl radicals such as benzyl, and phenylethyl radicals; olefinically unsaturated monovalent hydrocarbon radicals such as vinyl, allyl, cyclohexenyl radicals; cycloalkyl radicals such as cyclohexyl, cycloheptyl; halogenated monovalent hydrocarbon radicals such as dichloropropyl, 1,1,1-trifluoropropyl, chlorophenyl, dibromophenyl, and chloromethyl; cyanoalkyl radicals such as cyanoethyl, and cyanopropyl. Preferably, the radicals represented by $R^1$ through $R^{12}$ have less than eight carbon atoms and in particular it is preferred that $R^1$ through $R^{12}$ be methyl, ethyl, or phenyl.

Each a is an integer from 0 to 12 and preferably 0-3. Z is an integer from 1 to $10^2$ and preferably about 10 to about 20. Each x is an integer from 0 to 2.

The epoxy containing organosilicon glass resins represented by formula II above can be prepared by reacting HO-Si-terminated glass resins (IIb) with an excess of glycido containing mono- or polyfunctional alkoxy silicon compounds (IIa) in solutions (~20% of solids, diglyme, for example) for about 17-24 hours at 70° C. or for 3 hours at 120° C.

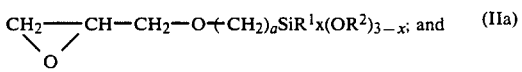

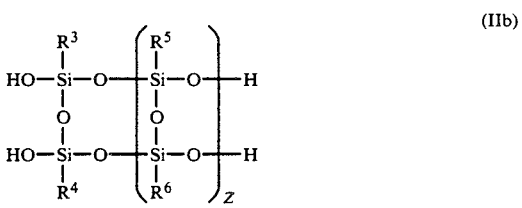

The epoxy containing glass resins represented by formula III above can be prepared by reacting monofunctional chlorosilanes such as [2-(3-cyclohexenyl)ethyl]dimethylchlorosilane (IIIa) with HO-terminated glass resins (IIb) in the presence of HCL acceptors (such as alkali metal carbonates including Na and K carbonates or organic trisubstituted amines including pyridine or triethyl amine) in excess of room temperature in ether solution (20%) according to the scheme:

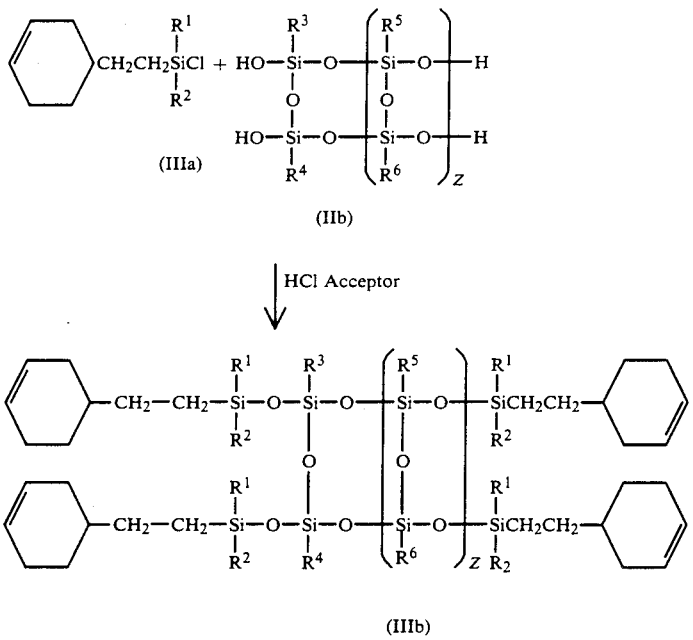

The product (IIIb) from the above reaction is then epoxidized by reaction with 3-chloroperoxybenzoic acid.

In cationic polymerizations, the onium salts are generally employed in amounts of about 0.5 to about 10% by weight and preferably about 4 to about 6% by weight based upon the material being polymerized.

The cationic polymerizable compositions can also include conventional additives such as filter, plasticizers, and diluents.

When used as a lithographic material, the compositions of the present invention are applied to a desired substrate to provide films, generally about 1 to about 25 microns, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials,, polyamides, and polyimides. The dielectric materials may be molded articles of the polymeric materials containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyofins such as polypropylene; polysulfones; polycarbonates; nitrile rubber; and ABS polymers.

The compositions after being applied to the desired substrate are imagewise exposed to ultraviolet light radiation in the near UV range of about 300 to about 400 nanometers at dosages of about 20 to about 100 millejoules/cm². The compositions are then developed in a suitable solvent. Being negative resist materials, that portion exposed to the ultraviolet light remains in place and provides the desired pattern.

According to another aspect of the present invention, the preferred epoxy functional silicones of the present invention as represented by formulae II and III hereinabove are sensitive to radiation in addition to the near ultraviolet light such as deep U.V. light, X-ray and preferably electron beam radiation. These materials when used as such are applied to a desired substrate to provide films, generally about 1 to about 25 microns thick, such as by spraying, spinning, dipping, or any other known means of application of coating. Some suitable substrates include those used in the fabrication of semiconductor devices or integrated circuits which include wafers or chips overcoated with oxides and nitrides (silicon oxide and/or silicon nitride for diffusion masks and passivation) and/or metals normally employed in the metallization steps for forming contacts and conductor patterns on the semiconductor chip.

In addition, the materials of the present invention can be used in conjunction with those substrates employed as chip carriers and including ceramic substrates and, especially, multilayer ceramic devices. Also included are dielectric substrates which can be thermoplastic and/or thermosetting polymers. Typical thermosetting polymeric materials include epoxy, phenolic-based materials,, polyamides, and polyimides. The dielectric materials may be molded articles of the polymeric materials containing fillers and/or reinforcing agents such as glass-filled epoxy or phenolic-based materials. Examples of some phenolic-type materials include copolymers of phenol, resorcinol, and cresol. Examples of some suitable thermoplastic polymeric materials include polyofins such as polypropylene; polysulfones; polycarbonates; nitrile rubber; and ABS polymers.

These preferred silicones after being applied to the desired substrate are imagewise exposed to radiation and preferably electron beam radiation at dosages of about 2 to about 4 microcoulombs/cm$^2$ and energy levels of about 25 to about 50 kilowatts. The compositions are then developed in a suitable solvent. Being negative resist materials, that portion exposed to the radiation remains in place and provides the desired pattern.

The following non-limiting examples are presented to further illustrate the present invention:

EXAMPLE 1

To a 30% solution of Quatrex 3450 in diglyme is added about 5% by weight of triphenyl sulphonium SbF$_6$ and about 2% by weight of anthracene methanol. This solution is spun cast onto a silicon wafer and dried to provide a thickness of about 1 micron. At 26 millejoules/cm$^2$ dose exposed through a 365 nanometer narrow band filter, 100% of the exposed thickness of the resist remains upon contact with the diglyme solvent.

COMPARISON EXAMPLE 2

Example 1 is repeated except the composition does not include anthracene methanol sensitizer. Even after 1000 millejoules/cm$^2$ expose dose though a 365 nanometer narrow band filter, none of the exposed thickness of the resist remains upon contact with the digylme solvent.

EXAMPLE 3

To a 30% solution of

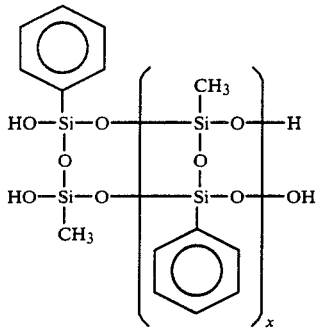

wherein x is 1, in diglyme is added 5% by weight of triphenylsulphonium hexafluoroantimonate and 1.5% by weight of anthracene methanol.

The solution is spun cast onto a silicon wafer and dried at about 90° C. for about 5 minutes to provide a thickness of about 2 microns.

The pattern is exposed using ultraviolet light having wavelength of about 365 nanometer at a dosage of about 20 millejoules/cm$^2$.

The part is then post baked at about 90° to about 100° C. for about 5 minutes to cause further crosslinking of the exposed polymer. The patter is then developed in amyl acetate followed by air drying to leave the final image.

EXAMPLE 4

An epoxy silicon is prepared by reacting

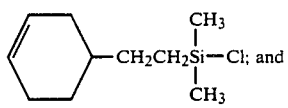

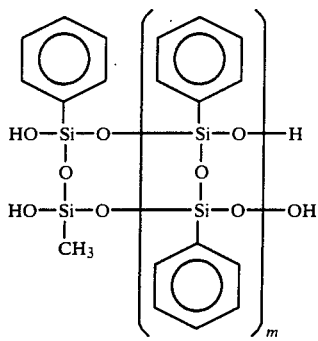

wherein m is 1 in the presence of an HCl acceptor.

Dissolve 100 grams of:

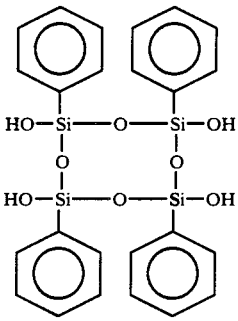

prepolymer (molecular weight=552 grams/mole Hydroxyl $$\text{weight} = \frac{552}{4} = 138 \frac{\text{grams}}{\text{mol.}} \text{ OH})$$

into at least 500 mls of tetrahydrofuran containing 20% molar excess of triethylamine. ADD drop wise, 72 moles (145.8 grams) of

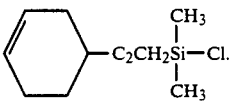

A white precipitate forms immediately. Vigorously stir solution for at least 24 hours. Filter off amine salt precipitate. Wash remaining solution with 1% HCl, 3 times—followed by aqueous sodium carbonate solution until pH of solution is 7-8. Dry over CaCl$_2$ or other suitable drying agents.

The product obtained is then epoxidized by reacting with 3-chloroperoxy benzoic acid in the following manner:

20 grams of

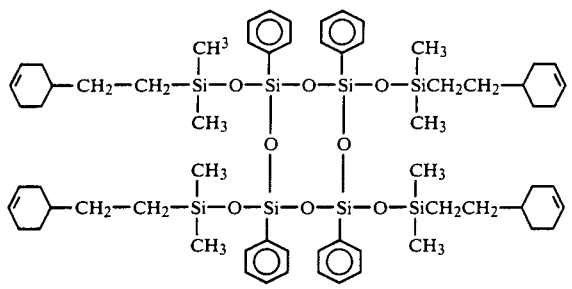

molecular weight=1216 grams/mole predissolved in 180 mls of methylene chloride. Add dropwise to solution of 10 grams of 85% m-chloroperbenzoic acid dissolved in 100 mls of methylene chloride. The temperature is maintained at 10° C. for 24 hours. A white precipitate slowly accumulates which is filtered off and discarded. The remaining solution is washed 1 time with 100 mls of 10% acetic acid, 3 time with 50 mls of deionized water and enough times with saturated sodium bicarbonate solution to achieve a neutral pH. The solution is then dried over a drying agent.

The polymer obtained can be represented by the following formula:

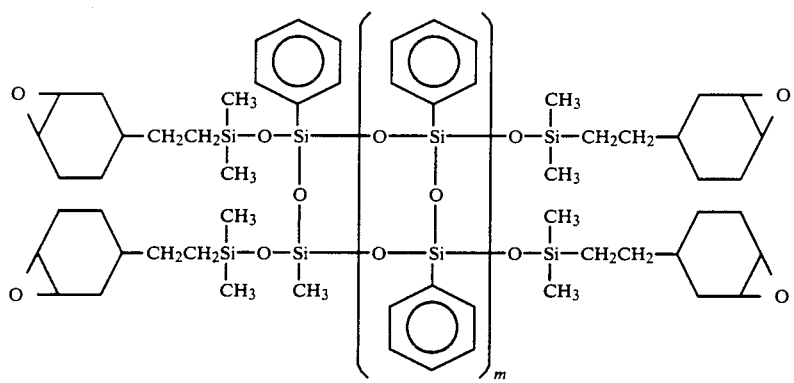

The above polymer is dissolved in diglyme to provide about a 25% by weight solution. To this solution are added about 5% by weight of triphenylsulfonium hexafluoroantimonate and about 2% by weight of 9-anthracene methanol. The solution is filtered to remove any undissolved solids and then coated onto a silicon wafer by spinning to provide a thickness of about 5 microns. The film is prebaked at about 90° C. for about 5 minutes and exposed to ultraviolet light of wavelength of about 360 nanometers at a dosage of about 60 millejoules/cm$^2$. After exposure, the wafers were baked at about 90° C. for about 3 minutes and developed in isoamyl acetate for about one minute followed by an isopropyl alcohol rinse. An image of very high resolution is obtained.

Also, the temperature stability of the organosilicon resist after exposure and development is extremely high. The patterns are heated to about 400° C. for about 24 hours without any distortion resulting from the heating and with less than 10% thickness loss.

EXAMPLE 5—(ELECTRON BEAM EXPOSURE)

A prepolymer having the same structure as employed in Example 4 is dissolved in diglyme to provide about a 25% by weight solution. The diglyme solution of the prepolymer is coated onto a silicon wafer spinning to provide a thickness of about 300 microns. The film is exposed to electron beam at 25 kilowatts at about 2–4 microcoulombs/cm$^2$. After exposure, the wafers are baked at about 90° C. for about 3 minutes and developed in isoamyl acetate to provide about 0.5 micron lines of very high resolution.

Also, the temperature stability of the organosilicon resist after exposure and development is extremely high. The patterns are treated to about 400° C. for about 24 hours without any distortion resulting from the heating and with less than 10% thickness loss.

EXAMPLE 6—(ELECTRON BEAM EXPOSURE)

Example 5 is repeated except that the diglyme solution of the prepolymer is applied onto a silicon substrate already coated with a baked 1.2 micron layer of Shipley AZ photoresist. The developed organosilicon resist is used as a mask for an oxygen reactive ion etching of the AZ photoresist. Such provides for excellent resolution and allows for undercutting of the AZ layer without edge collapse of the relatively thin organosilicon layer.

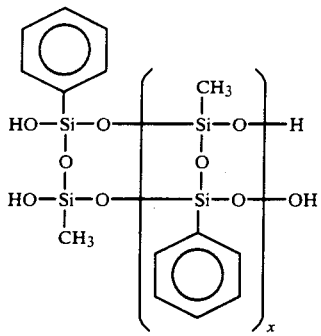
wherein x is 1 to 100.
16. The compositions of claim 14 wherein said silicon polymer is represented by the formula:
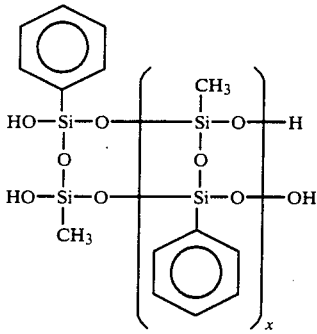
wherein x is 1 to 100.
16. The compositions of claim 14 wherein said silicon polymer is represented by the formula:
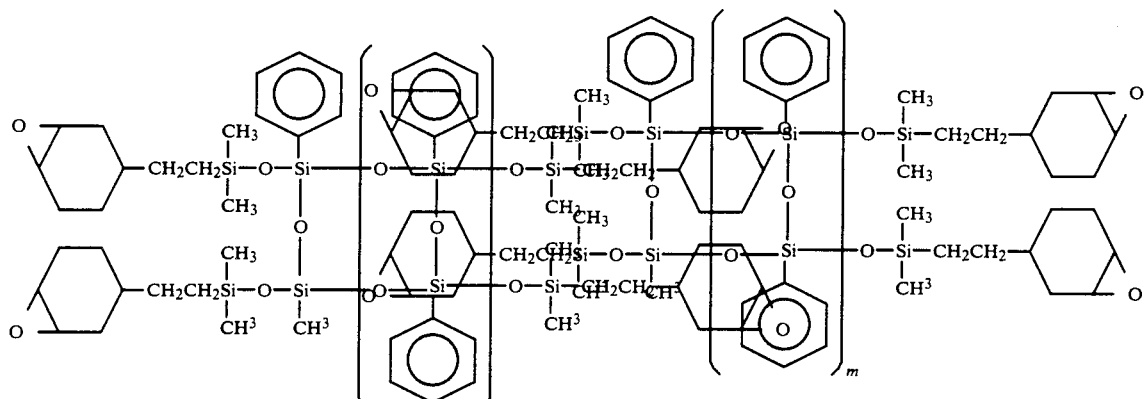

What is claimed is:

1. An ultraviolet light sensitive photoinitiator composition suitable for cationic polymerization reactions which comprises:

A) at least one anthracene derivative represented by the formula:

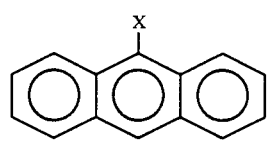

wherein X is CH=CH$_2$ or —(—CH$_2$—)—$_n$O—(—R) with R being selected from group consisting of H, and

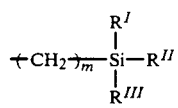

wherein each R$^I$, R$^{II}$ and R$^{III}$ individually is selected from the group consisting of alkyl, alkenyl aryl,

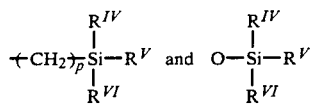

wherein each $R^{IV}$, $R^V$ and $R^{VI}$ individually is selected from the group consisting of alkyl, alkenyl and aryl;

wherein m is an integer of 0 to 4, p is an integer of 0 to 4; and n is an integer of 1 to 2;

B) an onium salt; and

C) an organic solvent wherein the weight ratio of A:B is about 1:2 to about 1:10.

2. The composition of claim 1 wherein said anthracene derivative is 9-anthracene methanol.

3. The composition of claim 1 wherein said anthracene derivative is 9-vinyl anthracene.

4. The composition of claim 1 wherein said athracene derivative is the trimethylsiloxy ether of 9-anthracene methanol.

5. The composition of claim 1 wherein said onium salt includes triphenyl sulfonium hexafluoroantimonate.

6. The composition of claim 1 wherein said onium salt is a 50/50 mixture of

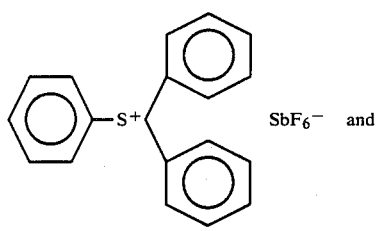

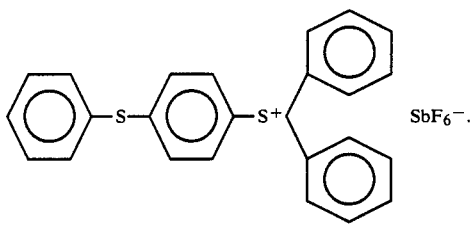

7. An ultraviolet light sensitive composition comprising:

A) a cationically polymerizable material;

B) an onium salt in an amount sufficient to cause polymerization of the cationically polymerizable material; and C) an anthracene derivative represent by the formula:

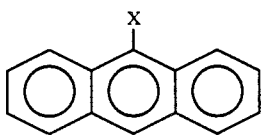

wherein X is CH=CH$_2$ or

—(—CH$_2$—)—$_n$ O—(—R) with R is selected from the group consisting of H,

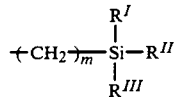

wherein each $R^I$, $R^{II}$ and $R^{III}$ individually is selected from the group consisting of alkyl, alkenyl, aryl,

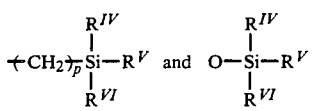

wherein each $R^{IV}$, $R^V$ and $R^{VI}$ individually is selected from the group consisting of alkyl, alkenyl and aryl; wherein m is an integer of 0 to 4, p is an integer of 0 to 4; and n is an integer of 1 to 2;

and wherein the weight of B:C is about 1:2 to about 1:10.

8. The composition of claim 7 wherein said anthracene derivative is 9-anthracene methanol.

9. The composition of claim 7 wherein said anthracene derivative is 9-vinyl anthracene.

10. The composition of claim 7 wherein said anthracene derivative is the trimethylsiloxy ether of 9-anthracene methanol.

11. The composition of claim 7 wherein said onium salt includes triphenyl sulfonium hexa-fluoroantimonate.

12. The composition of claim 7 wherein said onium salt is a 50/50 mixture of

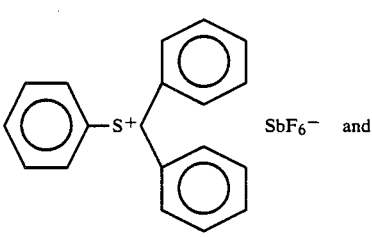

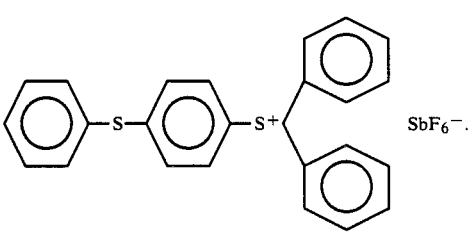

13. The compositions of claim 7 wherein said cationically polymerizable material is an epoxy polymer.

14. The compositions of claim 7 wherein said cationically polymerizable material is a silicone polymer.

15. The compositions of claim 14 wherein said silicone polymer is represented by the formula: